(12) United States Patent
Boose et al.

(10) Patent No.: US 8,347,242 B2
(45) Date of Patent: Jan. 1, 2013

(54) PROCESSING WIRING DIAGRAMS IN A DATA PROCESSING SYSTEM

(75) Inventors: Molly Louise Boose, Bellevue, WA (US); David Brayton Shema, Seattle, WA (US); Lawrence Sterne Baum, Bellevue, WA (US); Joseph Charles Hrin, Glen Mills, PA (US)

(73) Assignee: The Boeing Company, Chicago, IL (US)

( * ) Notice: Subject to any disclaimer, the term of this patent is extended or adjusted under 35 U.S.C. 154(b) by 403 days.

(21) Appl. No.: 12/652,520

(22) Filed: Jan. 5, 2010

(65) Prior Publication Data

US 2011/0167401 A1 Jul. 7, 2011

(51) Int. Cl.
*G06F 17/50* (2006.01)

(52) U.S. Cl. ........ 716/103; 716/104; 716/105; 716/106; 716/107

(58) Field of Classification Search ........... 716/103–107
See application file for complete search history.

(56) References Cited

U.S. PATENT DOCUMENTS

| 6,236,407 | B1* | 5/2001 | Leban et al. | 345/630 |
| 6,606,731 | B1 | 8/2003 | Baum et al. | |
| 7,439,648 | B2 | 10/2008 | Obara et al. | |
| 2002/0061681 | A1* | 5/2002 | Jenets | 439/610 |
| 2002/0150093 | A1* | 10/2002 | Ott et al. | 370/389 |
| 2002/0165632 | A1* | 11/2002 | Wada et al. | 700/97 |
| 2005/0203842 | A1* | 9/2005 | Sanchez et al. | 705/40 |

\* cited by examiner

*Primary Examiner* — Paul Dinh
(74) *Attorney, Agent, or Firm* — Yee & Associates, P.C.

(57) ABSTRACT

A method, computer program product, and apparatus for processing a wiring diagram is provided. Information associated with a number of components in the wiring diagram is identified. A scaling factor between a first format for the wiring diagram and a second format used by a software application configured to use wiring diagrams in the second format is identified. The scaling factor is applied to the information identified as being associated with the number of components in the wiring diagram to form processed information.

19 Claims, 10 Drawing Sheets

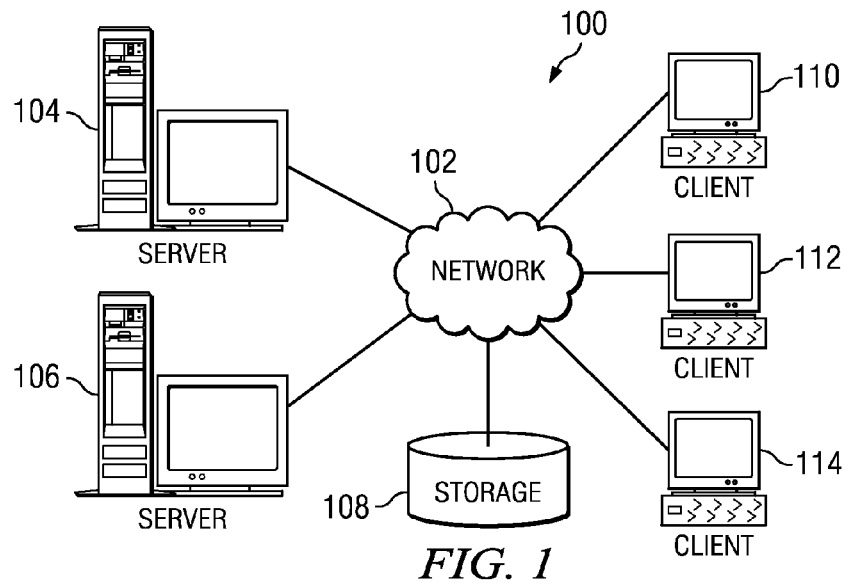
FIG. 1
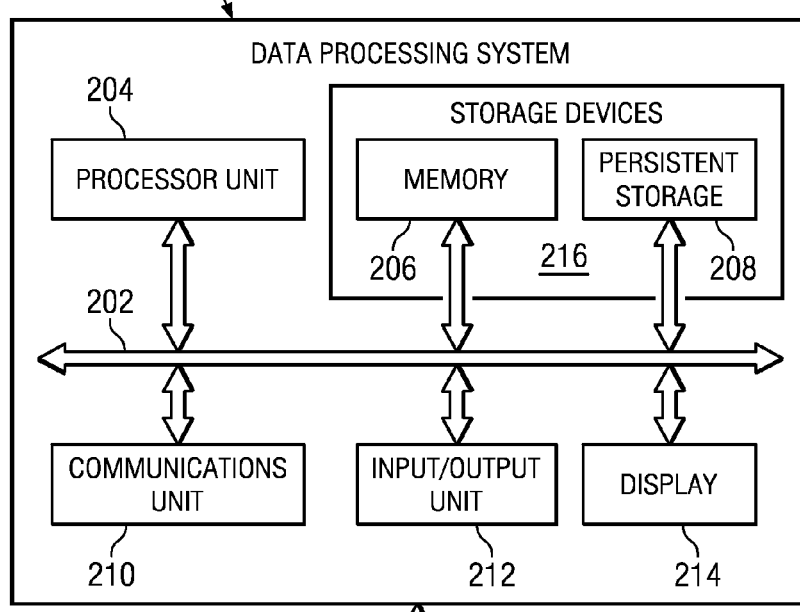
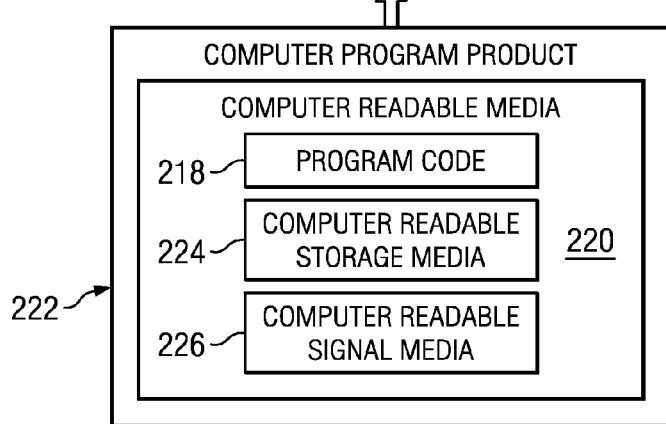
FIG. 2

```
                                              800
                   802         804           ↙
                    ↘           ↘      806
           808       <wire fullName="U75P24 BLU" graphicType="0" segment="-" id="109"
             ↘      bundle="W896" name="U75P24 BLU" gauge="" type="" suffix="" color=""
                    fromId="25" toId="0" shieldId="80" pSealLetter="" effCode="" emi=""
                    property="0" >
           810 ↘     <segment from="574, 418" to="600, 418" mode=" " string=" " />
           812 ↘     <segment from="600, 369" to="600, 418" mode=" " string=" " />
           814 ↘     <segment from="600, 369" to="620, 369" mode=" " string=" " />
           816 ↘     <segment from="620, 369" to="651, 369" mode="*" string=" " />
           818 ↘     <segment from="651, 369" to="760, 369" mode=" " string=" " />
                    </wire>
```

FIG. 8

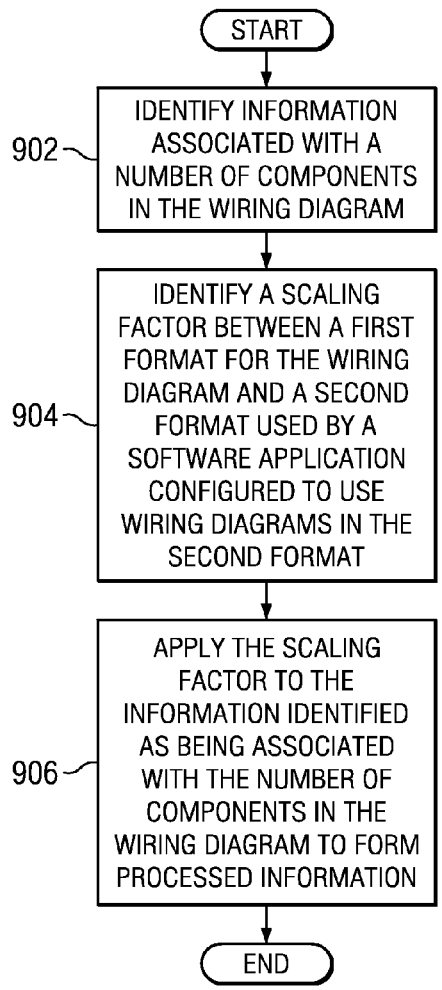

FIG. 9

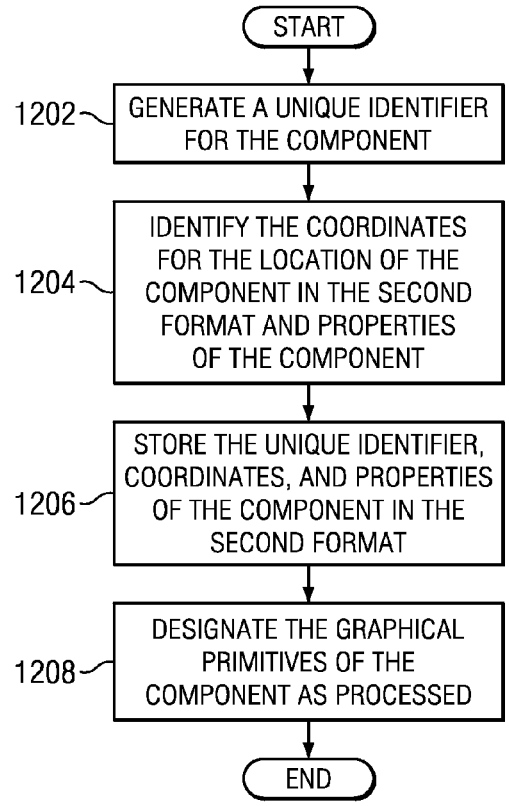

FIG. 12

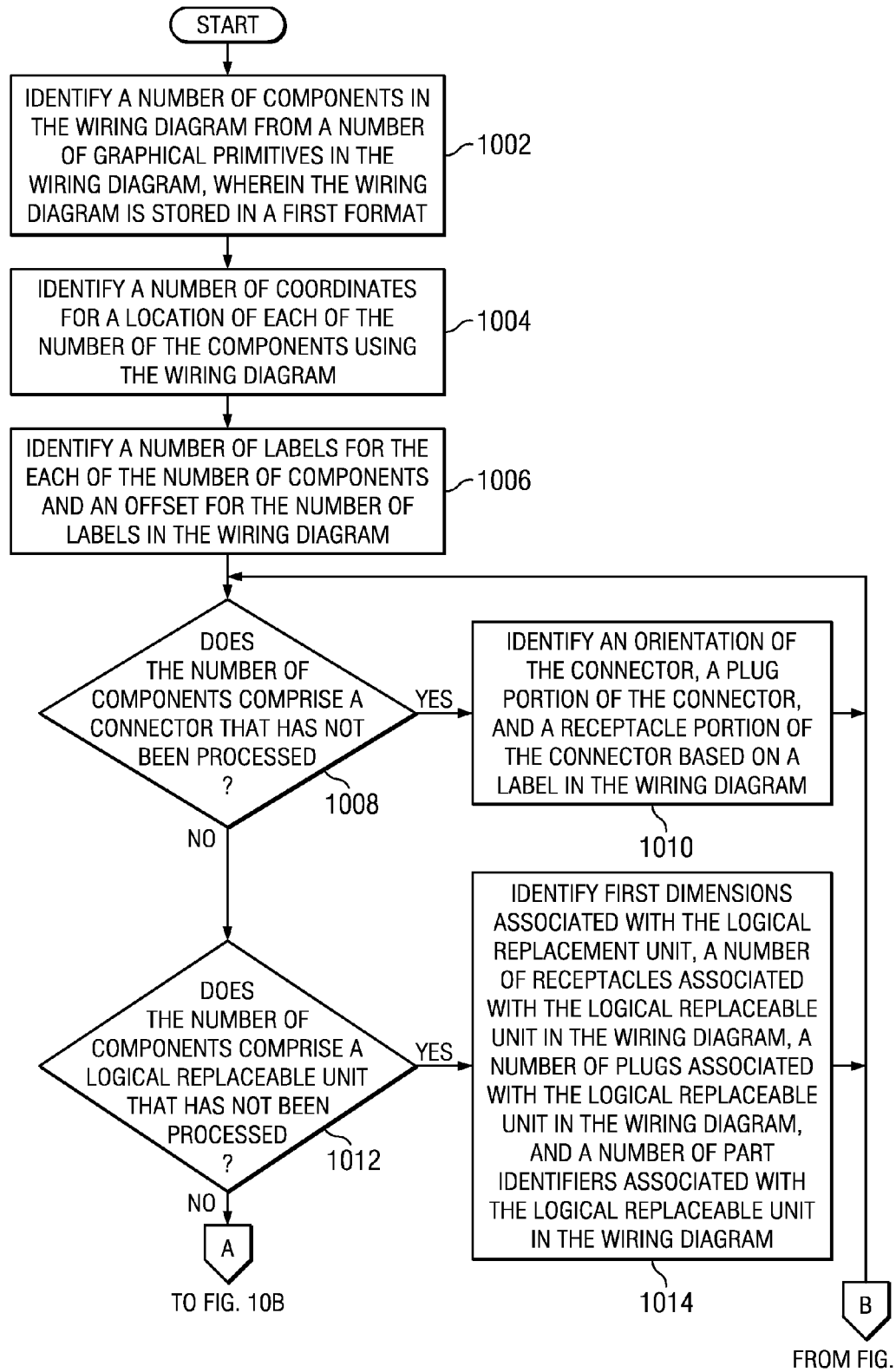

PROCESSING WIRING DIAGRAMS IN A DATA PROCESSING SYSTEM

BACKGROUND INFORMATION

1. Field

The present disclosure relates generally to data processing systems. More specifically, the present disclosure relates to processing wiring diagrams in a data processing system.

2. Background

Electrical systems commonly comprise two or more electrical components connected by one or more wires. The wires allow electrical signals to travel between the components along the path of the wires. Wires are often combined to connect multiple components in a wiring system. In some examples, multiple wires are used to connect two components. The multiple wires allow multiple electrical signals to be transmitted and received by the two components at substantially the same time.

A number of wiring diagrams may be used to document a wiring system. The wiring diagrams may contain specifications of the location of components or wires, type of components or wires, size of components or wires, number of components or wires or another suitable specification. The wiring diagrams may be used in designing the wiring system, constructing the wiring system, or remedying inconsistencies in the wiring system. For example, a technician may use a wiring diagram to locate an inconsistency in the wiring system and determine a replacement part that upholds the original design of the wiring system.

Wiring diagrams are commonly stored digitally. Wiring diagrams stored digitally may be stored in a particular format. The format is a particular specification for a wiring diagram relied upon by software that presents or changes the wiring diagram. For example, a wiring diagram may be stored in a computer graphics metafile (CGM) format. A wiring diagram may also be stored as vector art, a bitmap, or a computer aided design model. In a computer graphics metafile format, the wiring diagram may comprise images and/or text. Software that is capable of interpreting the computer graphics metafile format may read and write the images and/or text stored in the wiring diagram to present the wiring diagram.

Wiring diagrams stored in one format may be unreadable by software that reads and writes wiring diagrams stored in a second format. Wiring diagrams stored in the first format may be redrawn by an artist in the second format. The artist views the wiring diagram stored in the first format. The artist then recreates the components and wires from the wiring diagram in the first format in a wiring diagram in the second format. Recreating the components and wires in the second format is costly and time-consuming for a human.

Therefore, it would be advantageous to have a method and apparatus that takes into account one or more of the issues discussed above, as well as other possible issues.

SUMMARY

In one advantageous embodiment, a method for processing a wiring diagram is provided. Information associated with a number of components in the wiring diagram is identified. A scaling factor between a first format for the wiring diagram and a second format used by a software application configured to use wiring diagrams in the second format is identified. The scaling factor is applied to the information identified as being associated with the number of components in the wiring diagram to form processed information.

In another advantageous embodiment, another method for processing a wiring diagram is provided. A number of components in the wiring diagram from a number of graphical primitives in the wiring diagram are identified. The wiring diagram is stored in a first format. A number of coordinates are identified for a location of each of the number of components using the wiring diagram. A number of labels are identified for the each of the number of components and an offset for the number of labels in the wiring diagram. An orientation of a connector, a plug portion of the connector, and a receptacle portion of the connector are identified based on a label in the wiring diagram responsive to the number of components comprising the connector. First dimensions associated with a line replaceable unit, a number of receptacles associated with the line replaceable unit in the wiring diagram, a number of plugs associated with the line replaceable unit in the wiring diagram, and a number of part identifiers associated with the line replaceable unit in the wiring diagram are identified responsive to the number of components comprising the line replaceable unit. Second dimensions and a number of terminals associated with a shield in the wiring diagram are identified responsive to the number of components comprising the shield. A number of termination points and a number of characteristics associated with a wire in the wiring diagram are identified responsive to the number of components comprising the wire. A scaling factor between the first format and a second format is identified. The scaling factor comprises a linear transformation between a first width of a first component in the first format and a second width of a second component in the second format. The scaling factor is applied to the number of coordinates, the offset, the first dimensions, and the second dimensions to form processed information. The processed information is stored in the second format.

In yet another advantageous embodiment, a computer program product is provided. The computer program product comprises a computer readable storage medium. The computer program product further comprises first program code, stored on the computer readable storage medium, for identifying information associated with a number of components in a wiring diagram. The computer program product further comprises second program code, stored on the computer readable storage medium, for identifying a scaling factor between a first format for the wiring diagram and a second format used by a software application configured to use wiring diagrams in the second format. The computer program product further comprises third program code, stored on the computer readable storage medium, for applying the scaling factor to the information identified as being associated with the number of components in the wiring diagram to form processed information.

In yet another advantageous embodiment, an apparatus is provided. The apparatus comprises a bus system, a memory connected to the bus system, and a processor unit connected to the bus system and configured to run a program to identify information associated with a number of components in a wiring diagram, identify a scaling factor between a first format for the wiring diagram and a second format used by a software application configured to use wiring diagrams in the second format, and apply the scaling factor to the information identified as being associated with the number of components in the wiring diagram to form processed information.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

FIG. 1 depicts an illustration of a network data processing system in which an advantageous embodiment may be implemented;

FIG. 2 depicts an illustration of a data processing system in accordance with an advantageous embodiment;

FIG. 8 depicts an illustration of an output containing a wire in accordance with an advantageous embodiment;

FIG. 9 depicts a flowchart of a process for processing a wiring diagram in accordance with an advantageous embodiment;

FIG. 12 depicts a flowchart of a process for identifying information associated with a line replaceable unit, a shield, or a reference in accordance with an advantageous embodiment.

DETAILED DESCRIPTION

Figure 3:
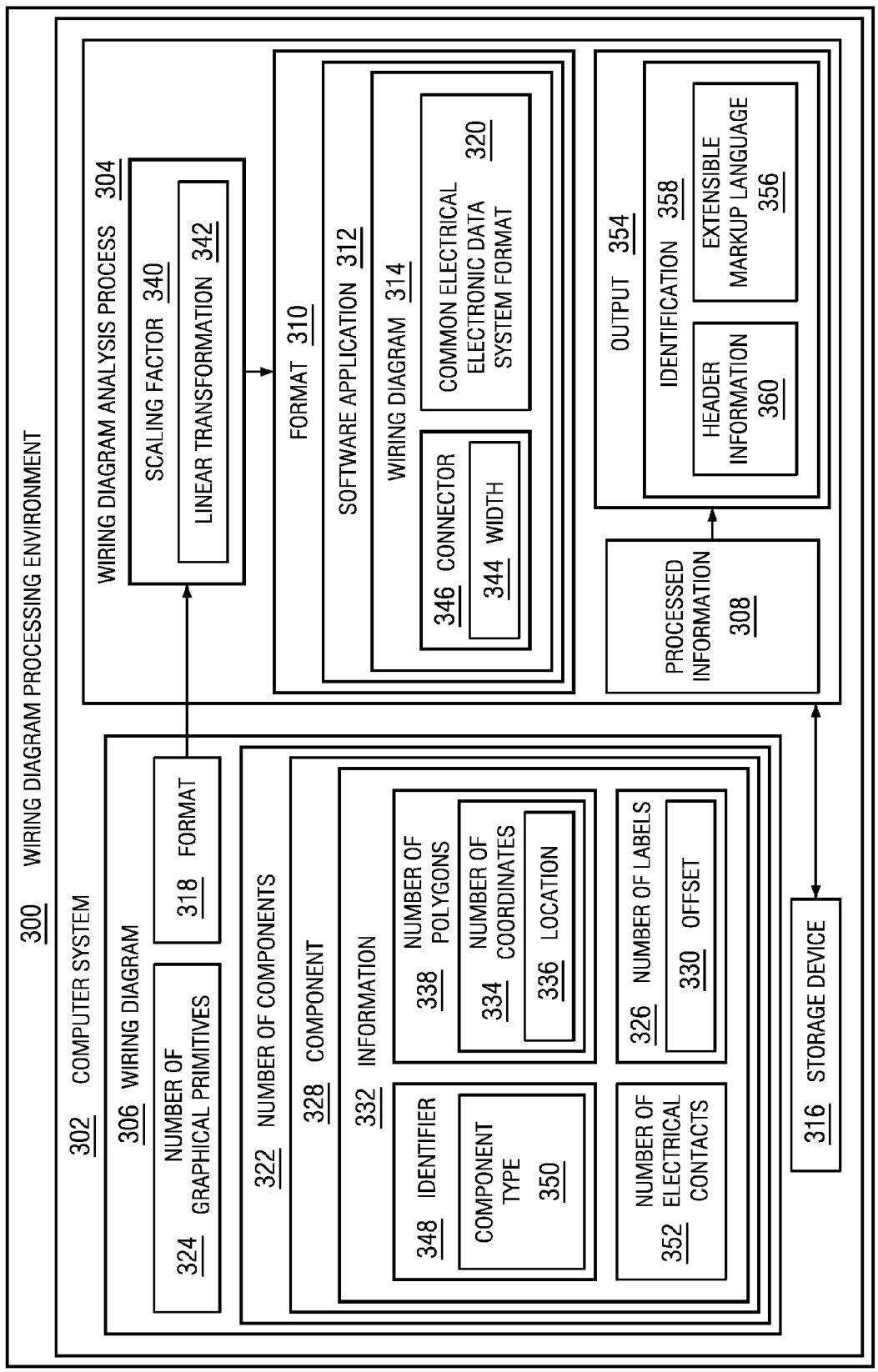
FIG. 3 depicts an illustration of a wiring diagram processing environment in accordance with an advantageous embodiment.

With reference now to the figures and in particular with reference to FIGS. 1-2, exemplary diagrams of data processing environments are provided in which illustrative embodiments may be implemented. It should be appreciated that FIGS. 1-2 are only exemplary and are not intended to assert or imply any limitation with regard to the environments in which different embodiments may be implemented. Many modifications to the depicted environments may be made.

FIG. 1 depicts a pictorial representation of a network of data processing systems in which illustrative embodiments may be implemented. Network data processing system 100 is a network of computers in which the illustrative embodiments may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. Clients 110, 112, and 114 may be, for example, personal computers or network computers. In the depicted example, server 104 provides information, such as boot files, operating system images, and applications to clients 110, 112, and 114. Clients 110, 112, and 114 are clients to server 104 in this example. Network data processing system 100 may include additional servers, clients, and other devices not shown.

In these examples, clients 110, 112, and 114 may process a number of wiring diagrams. The number of wiring diagrams may be stored on server 104 and/or server 106 or on clients 110, 112, and/or 114. Additionally, clients 110, 112, and 114 may locate information regarding a target format for wiring diagrams on server 104 and/or server 106.

Program code located in network data processing system 100 may be stored on a computer recordable storage medium and downloaded to a data processing system or other device for use. For example, program code may be stored on a computer recordable storage medium on server 104 and downloaded to client 110 over network 102 for use on client 110.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for the different illustrative embodiments.

With reference now to FIG. 2, a diagram of a data processing system is depicted in accordance with an illustrative embodiment. Data processing system 200 is an example of a computer, such as server 104 or client 110 in FIG. 1, in which computer usable program code or instructions implementing the processes may be located for the illustrative embodiments. In this illustrative example, data processing system 200 includes communications fabric 202, which provides communications between processor unit 204, memory 206, persistent storage 208, communications unit 210, input/output (I/O) unit 212, and display 214.

Processor unit 204 serves to execute instructions for software that may be loaded into memory 206. Processor unit 204 may be a set of one or more processors or may be a multiprocessor core, depending on the particular implementation. Further, processor unit 204 may be implemented using one or more heterogeneous processor systems, in which a main processor is present with secondary processors on a single chip. As another illustrative example, processor unit 204 may be a symmetric multi-processor system containing multiple processors of the same type.

Memory 206 and persistent storage 208 are examples of storage devices 216. A storage device is any piece of hardware that is capable of storing information, such as, for example, without limitation, data, program code in functional form, and/or other suitable information either on a temporary basis and/or a permanent basis. Memory 206, in these examples, may be, for example, a random access memory, or any other suitable volatile or non-volatile storage device. Persistent storage 208 may take various forms, depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 may be removable. For example, a removable hard drive may be used for persistent storage 208.

Communications unit 210, in these examples, provides for communication with other data processing systems or devices. In these examples, communications unit 210 is a network interface card. Communications unit 210 may provide communications through the use of either or both physical and wireless communications links.

Input/output unit 212 allows for the input and output of data with other devices that may be connected to data processing system 200. For example, input/output unit 212 may provide a connection for user input through a keyboard, a mouse, and/or some other suitable input device. Further, input/output unit 212 may send output to a printer. Display 214 provides a mechanism to display information to a user.

Instructions for the operating system, applications, and/or programs may be located in storage devices 216, which are in communication with processor unit 204 through communications fabric 202. In these illustrative examples, the instructions are in a functional form on persistent storage 208. These instructions may be loaded into memory 206 for execution by processor unit 204. The processes of the different embodiments may be performed by processor unit 204 using computer implemented instructions, which may be located in a memory, such as memory 206.

These instructions are referred to as program code, computer usable program code, or computer readable program code that may be read and executed by a processor in processor unit 204. The program code, in the different embodiments, may be embodied on different physical or computer readable storage media, such as memory 206 or persistent storage 208.

Program code 218 is located in a functional form on computer readable media 220 that is selectively removable and may be loaded onto or transferred to data processing system 200 for execution by processor unit 204. Program code 218 and computer readable media 220 form computer program product 222. In one example, computer readable media 220 may be computer readable storage media 224 or computer readable signal media 226. Computer readable storage media 224 may include, for example, an optical or magnetic disc that is inserted or placed into a drive or other device that is part of persistent storage 208 for transfer onto a storage device, such as a hard drive, that is part of persistent storage 208. Computer readable storage media 224 also may take the form of a persistent storage, such as a hard drive, a thumb drive, or a flash memory that is connected to data processing system 200. In some instances, computer readable storage media 224 may not be removable from data processing system 200.

Alternatively, program code 218 may be transferred to data processing system 200 using computer readable signal media 226. Computer readable signal media 226 may be, for example, a propagated data signal containing program code 218. For example, computer readable signal media 226 may be an electro-magnetic signal, an optical signal, and/or any other suitable type of signal. These signals may be transmitted over communications links, such as wireless communications links, an optical fiber cable, a coaxial cable, a wire, and/or any other suitable type of communications link. In other words, the communications link and/or the connection may be physical or wireless in the illustrative examples. The computer readable media also may take the form of non-tangible media, such as communications links or wireless transmissions containing the program code.

In some illustrative embodiments, program code 218 may be downloaded over a network to persistent storage 208 from another device or data processing system through computer readable signal media 226 for use within data processing system 200. For instance, program code stored in a computer readable storage media in a server data processing system may be downloaded over a network from the server to data processing system 200. The data processing system providing program code 218 may be a server computer, a client computer, or some other device capable of storing and transmitting program code 218.

The different components illustrated for data processing system 200 are not meant to provide architectural limitations to the manner in which different embodiments may be implemented. The different illustrative embodiments may be implemented in a data processing system including components in addition to or in place of those illustrated for data processing system 200. Other components shown in FIG. 2 can be varied from the illustrative examples shown. The different embodiments may be implemented using any hardware device or system capable of executing program code. As one example, data processing system 200 may include organic components integrated with inorganic components and/or may be comprised entirely of organic components excluding a human being. For example, a storage device may be comprised of an organic semiconductor.

As another example, a storage device in data processing system 200 is any hardware apparatus that may store data. Memory 206, persistent storage 208, and computer readable media 220 are examples of storage devices in a tangible form.

In another example, a bus system may be used to implement communications fabric 202 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 206 or a cache such as found in an interface and memory controller hub that may be present in communications fabric 202.

The different advantageous embodiments recognize and take into account a number of different considerations. The different advantageous embodiments recognize and take into account that converting wiring diagrams from a first format to a second format by a human is inefficient because the human recreates each component and wire in the wiring diagram manually and based on a visual interpretation of the wiring diagram in the first format. The different advantageous embodiments recognize that converting a wiring diagram from a first format to a second format without a human recreating the components and wires reduces costs and increases productivity and safety over a manual recreation by a human.

The different advantageous embodiments also recognize that converting wiring diagrams from a first format to a second format is advantageous when the first format is a legacy format. A legacy format is a format that is not supported by current software for presenting and modifying wiring diagrams and not expected to be supported by such software in the future.

Converting wiring diagrams from a first format to a second format may also be advantageous when the second format is a standard format. A standard format is a format that is supported and agreed upon by creators of current software for presenting and modifying wiring diagrams. For example, a common electrical electronic data system format is a standard format for wiring diagrams. Once the wiring diagram is in a standard format, the wiring diagram may be presented and modified using current and future software for presenting and modifying wiring diagrams. One example of such software is version r18a.10 of HarnessSys from Israel Aersospace Industries Ltd.

Additionally, the different advantageous embodiments recognize that storing the data in a particular format may allow for greater number of presentation styles than another format. For example, common electrical electronic data system format provides for a number of symbol libraries to be used to present the wiring diagram. The different symbol libraries allow the wiring diagram to be presented at different sizes and scales.

Thus, the different advantageous embodiments provide a method, computer program product, and apparatus for processing a wiring diagram. Information associated with a number of components in the wiring diagram is identified. A scaling factor between a first format for the wiring diagram and a second format used by a software application configured to use wiring diagrams in the second format is identified. The scaling factor is applied to the information identified as being associated with the number of components in the wiring diagram to form processed information.

Turning now to FIG. 3, an illustration of a wiring diagram processing environment is depicted in accordance with an advantageous embodiment. Wiring diagram processing environment 300 may be implemented within network data processing system 100.

Computer system 302 runs wiring diagram analysis process 304 within wiring diagram processing environment 300. Computer system 302 running wiring diagram analysis process 304 processes wiring diagram 306. Computer system 302 is an example implementation of data processing system 200 in FIG. 2. In these examples, wiring diagram processing environment 300 processes wiring diagram 306 to generate processed information 308. Processed information 308 may be data representing the components in a wiring diagram in format 310.

Format 310 is a specification for the manipulation and storage of data. For example, format 310 may be a format used by software application 312. Software application 312 is software that reads and/or writes wiring diagrams 314 that are stored in format 310.

Wiring diagram 306 is stored in wiring diagram processing environment 300. For example, wiring diagram 306 may be stored on storage device 316. Storage device 316 is an example implementation of storage device 218 in FIG. 2. Wiring diagram 306 is stored in format 318. Format 318 is also a specification for the manipulation and storage of data. In these examples, format 318 is different from format 310. For example, format 318 may be computer graphics metafile format and format 310 may be common electrical electronic data system format 320.

Wiring diagram analysis process 304 identifies number of components 322 in wiring diagram 306. In one advantageous embodiment, wiring diagram analysis process 304 identifies number of components 322 by identifying number of graphical primitives 324. Number of graphical primitives 324 are lines or geometric shapes formed by the data in wiring diagram 306. For example, in an advantageous embodiment in which format 318 is computer graphic metafile format, wiring diagram analysis process 304 identifies number of graphical primitives 324 by identifying line segments and geometric shapes in wiring diagram 306. Wiring diagram analysis process 304 may then compare number of graphical primitives 324 to known representations of components to identify number of components 322. The representations may be stored in a repository of components.

Wiring diagram analysis process 304 also uses number of labels 326 for identifying number of components 322. Number of labels 326 are textual information presented with proximity to component 328. Number of labels 326 may have a particular offset 330 from component 328. Offset 330 is a distance between number of labels 326 and component 328.

Number of components 322 are parts of an electrical system represented in wiring diagram 306. In one advantageous embodiment, number of components 322 comprises number of graphical primitives 324. Number of components 322 may provide functionality to the electrical system depicted in wiring diagram 306. For example, number of components 322 may comprise connectors, wires, shields, line replaceable units, or another suitable part of an electrical system. In these examples, wiring diagram analysis process 304 identifies component 328 in wiring diagram 306.

Once wiring diagram analysis process 304 identifies component 328, wiring diagram analysis process 304 identifies information 332 associated with component 328. Information 332 is characteristics and parameters of component 328. For example, component 328 may be a connector. In such an example, information 332 may be an orientation of the connector. Wiring diagram analysis process 304 may also identify information 332 for the plug portion and receptacle portion of the connector. Wiring diagram analysis process 304 then stores information 332 as processed information 308.

Wiring diagram analysis process 304 may modify information 332 prior to storing information 332 as processed information 308 based on differences between format 318 and format 310. For example, information 332 may comprise number of coordinates 334. Number of coordinates 334 represents location 336 of component 328 in wiring diagram 306. In some advantageous embodiments, number of coordinates 334 represents the boundaries of number of polygons 338. Number of polygons 338 comprise a graphical representation of component 328 in wiring diagram 306.

Format 310 may specify a different coordinate system than format 318. Thus, wiring diagram analysis process 304 may modify number of coordinates 334 prior to storing number of coordinates 334 in processed information 308. Wiring diagram analysis process 304 may modify information 332 by applying scaling factor 340 to information 332.

Wiring diagram analysis process 304 generates scaling factor 340 by applying linear transformation 342 to information 332. Scaling factor 340 is a multiplier that may be applied to information 332 in format 318 to generate information 332 in format 310. For example, wiring diagram analysis process 304 generates a scaling factor that identifies component 328, where component 328 is a connector.

Wiring diagram analysis process 304 identifies the width of the connector. In one advantageous embodiment, wiring diagram analysis process 304 identifies the width of the connector by identifying the distance between number of polygons 338 that comprise the connector. Wiring diagram analysis 338 then identifies width 344 of connector 346 in format 310. Connector 346 is a connector of the same type as the connector identified in wiring diagram 306.

Wiring diagram analysis process 304 then generates scaling factor 340 by dividing the width of the connector in format 318 by width 344 in format 310. In other words, scaling factor 340 equals width of the connector in format 318 divided by width 344 of connector 346 in format 310.

Wiring diagram analysis process 304 then applies scaling factor 340 to information 332. It should be noted that, in some advantageous embodiments, wiring diagram analysis process 304 applies scaling factor 340 to only a portion of information 332 associated with component 328. In this advantageous embodiment, scaling factor 340 is only applied to positional and/or dimensional information 332. For example, wiring diagram analysis process 304 may apply scaling factor 340 to number of coordinates 338 and offset 330, but not identifier 348 or number of labels 326.

Wiring diagram analysis process 304 may identify identifier 348 as information 332 associated with component 328. Identifier 348 may designate component type 350 for component 328. For example, identifier 348 may be a part number that represents a particular type of connector identified in wiring diagram 306. Wiring diagram analysis process 304 may modify identifier 348 to another part number, if the specification for format 310 specifies another system of identifiers. In another advantageous embodiment, identifier 348 is modified to a random identification number in format 310 for the information.

When identifying information 332, wiring diagram analysis process 304 may identify number of electrical contacts 352. Number of electrical contacts 352 are conductive points of contact associated with component 328.

For example, a connector may have six of number of electrical contacts 352. On the other hand, a wire may have two of number of electrical contacts 352 where one contact is on each end of the wire. Wiring diagram analysis 304 stores number of electrical contacts 352 as processed information 308 in format 310. Wiring diagram analysis 304 also identifies additional information 332 associated with number of electrical contacts 352 and processes any additional information 332.

When wiring diagram analysis process 304 has identified information 332 with respect to number of components 322, wiring diagram analysis process 304 then stores a representation of the circle as processed information wiring diagram analysis process 304 stores processed information 308 in format 310 to form output 354. Output 354 is data or a file that contains a representation of wiring diagram 306 in format 310.

Wiring diagram analysis process 304 then stores the portion of number of graphical primitives 324 that was not processed as part of number of components 322 in output 354 in format 310. For example, wiring diagram 306 may have a circle calling attention to a particular area. The circle may not have functional relevance in wiring diagram 306. The circle would remain on number of graphical primitives 324 after identifying number of components 322 because the circle was not a component. Thus, wiring diagram analysis process 304 stores the circle by its coordinates in output 354. The coordinates may be modified by applying scaling factor 340 to the coordinates.

In one advantageous embodiment, output 354 is extensible markup language (XML) 356. In such an advantageous embodiment, wiring diagram analysis process 304 stores output 354 with identification 358 in the form of header information 332. Identification 358 is a designation of format 310. For example, header information 332 may indicate that format 310 of output 354 is common electrical electronic data system format 320. Such an indication may be in the form of a document type definition (DTD) declaration.

A first component is considered to be associated with a second component by being secured to the second component, bonded to the second component, fastened to the second component, and/or connected to the second component in some other suitable manner. The first component also may be connected to the second component by using a third component. The first component is also considered to be associated with the second component by being formed as part of and/or an extension of the second component.

The illustration of wiring diagram analysis process 304 in wiring diagram processing environment 300 is not meant to imply physical or architectural limitations to the manner in which different features may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, wiring diagram analysis process 304 may identify number of components 322 with respect to multiple wiring diagrams 306. Wiring diagram analysis process 304 may then combine number of components from the various wiring diagrams 306 into processed information 308. Format 318 for the wiring diagrams 306 may differ from one another. Additionally, scaling factor 340 may be another type of transformation than linear transformation 342. For example, scaling factor 340 may be a non-linear transformation, based on the specification of format 318 and/or format 310.

Figure 4:
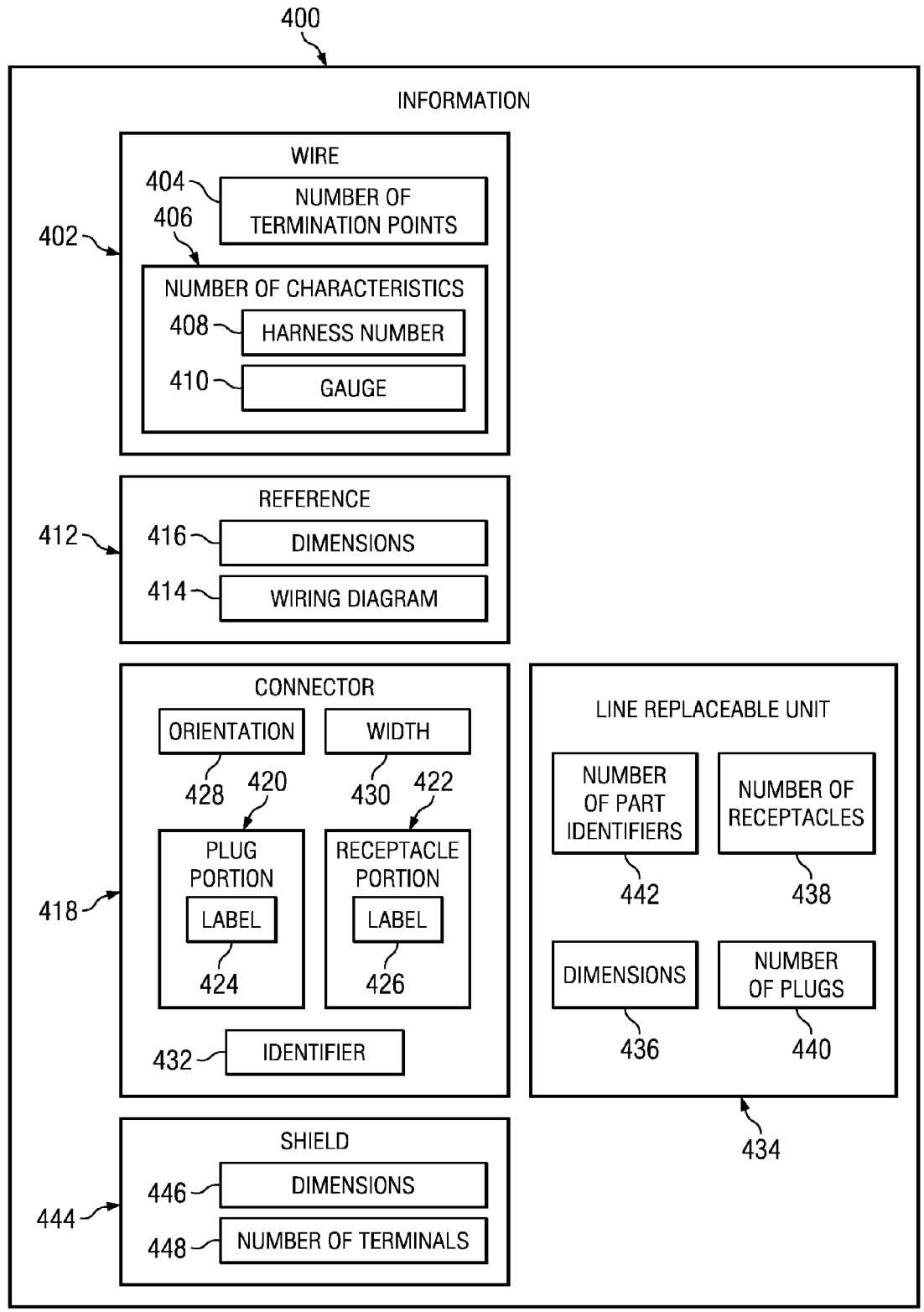
FIG. 4 depicts an illustration of an information in accordance with an advantageous embodiment.

Turning now to FIG. 4, information is depicted in accordance with an advantageous embodiment. Information 400 is an example implementation of information 332 in FIG. 3. Information 400 is identified by a wiring diagram analysis process for a component in a wiring diagram, such as wiring diagram 306 in FIG. 3.

In one advantageous embodiment, information 400 may be associated with wire 402. When information 400 is associated with wire 402, the wiring diagram analysis process also identifies number of termination points 404. Number of termination points 404 are the components or other locations to which wire 402 is connected.

The wiring diagram analysis process may then identify information for components at each of number of termination points 404. Information 400 may also be number of characteristics 406 of wire 402.

Characteristics 406 may be physical or electrical. For example, harness number 408 and gauge 410 are examples of characteristics 406. Harness number 408 is an identifier that may be unique or representative of a type of harness.

In another advantageous embodiment, information 400 is associated with reference 412. Reference 412 is an indication on the wiring diagram containing the reference that the portion referred to by reference 412 is continued on another wiring diagram 414. Information 400 associated with reference 412 may comprise the target of the location referred to by reference 412. Reference 412 may comprise letters and/or graphical content. Reference 412 also has dimensions 416. In addition to reference 412, the wiring diagram analysis process stores dimensions 416 in processed information 308. However, the wiring diagram analysis process may modify dimensions 416 by applying a scaling factor, such as scaling factor 340 in FIG. 3.

In yet another advantageous embodiment, information 400 is associated with connector 418. Connector 418 is an electrical connector that temporarily or permanently binds a plug and a receptacle. The plug and receptacle may be bound to other electrical components. For example, connector 418 may bind together a number of wires, such as wire 402. The wiring diagram analysis process identifies connector 418, including plug portion 420 and receptacle portion 422. In this advantageous embodiment, plug portion 420 is a portion of connector 418 that has pins. The pins fit into receivers in receptacle portion 422. The receivers may be referred to as sockets. Of course, in other advantageous embodiments, plug portion 420 has sockets and receptacle portion 422 has sockets. In such advantageous embodiments, the pins in receptacle portion 422 are received by the sockets in plug portion 420. Information 400 may also comprise a configuration of pins in connector 418. Such a layout may be identified by the wiring diagram analysis process using label 424 and/or label 426.

In such an advantageous embodiment, information 400 may also comprise orientation 428. Orientation 428 is a direction which connector 418 is facing in wiring diagram 306. Additionally, information 400 may comprise width 430. Width 430 may be used to determine a scaling factor for the wiring diagram. Information 400 may also include identifier 432 in such an advantageous embodiment. Identifier 432 is an identifier associated with a line replaceable unit connected to connector 418. Identifier 432 may only be present in advantageous embodiments in which connector 418 is connected to a line replaceable unit, such as line replaceable unit 434.

In another advantageous embodiment, information 400 is associated with line replaceable unit 434. Line replaceable unit 434 is a collection of other electrical components that form one or more electrical systems or subsystems. Line replaceable unit 434 may also comprise an interface that connects line replaceable unit 434 to electrical components outside line replaceable unit 434. In one advantageous embodiment, the interface is standardized. In other words, the communication parameters of the interface are documented such that other components may be designed to communicate with line replaceable unit 434. Line replaceable unit 434 may be disconnected from an electrical system and replaced with a substantially identical or different line replaceable unit 434.

Line replaceable unit 434 has dimensions 436. Dimensions 436 comprise a height and width of line replaceable unit 434. Line replaceable unit 434 may also comprise number of receptacles 438 and/or number of plugs 440. Number of receptacles 438 are receivers that receive pins in number of plugs 440. Information 400 may also comprise number of part identifiers 442 associated with line replaceable unit 434. Number of part identifiers 442 may refer to part numbers of line replaceable unit 434 or a component part of line replaceable unit 434.

In yet another advantageous embodiment, information 400 is associated with shield 444. Shield 444 is a component that protects another component from an effect. The effect may be electromagnetic interference. For example, shield 444 may surround a portion of wire 402 to protect wire 402 from electromagnetic interference caused by a component nearby to wire 402. Information associated with shield 444 comprises dimensions 446 of shield 444 and number of terminals 448. Number of terminals 448 are the connection points between shield 444 and the component being protected. The wiring diagram analysis process may apply a scaling factor to dimensions 446 prior to storing dimensions 446 as processed information.

Figures 5, 6:
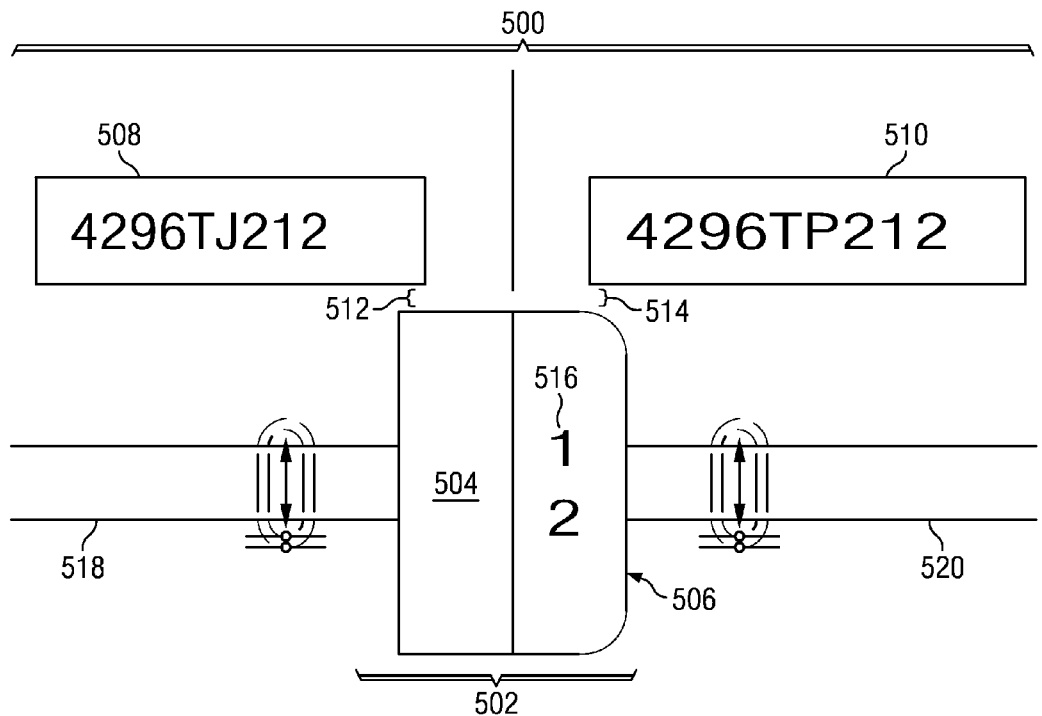
FIG. 5 depicts an illustration of a portion of a wiring diagram containing a connector in accordance with an advantageous embodiment.
FIG. 6 depicts an illustration of an output containing a connector in accordance with an advantageous embodiment.

Turning now to FIG. 5, an illustration of a portion of a wiring diagram containing a connector is depicted in accordance with an illustrative embodiment. Portion 500 is a portion of a wiring diagram, such as wiring diagram 306 in FIG. 3. Portion 500 may be processed by a wiring diagram analysis process, such as wiring diagram analysis process 304. Portion 500 may be stored in a format, such as format 318.

Connector 502 is present in portion 500. Connector 502 is an example implementation of connector 418 in FIG. 4. In this example, connector 502 connects wire 518 and wire 520. Labels 508 and 510 indicate a part number for connector 500.

In this advantageous embodiment, labels 508 and 510 also indicate which side of connector 500 is receptacle 504 and which side of connector 500 is plug 506. Receptacle 504 is an example implementation of receptacle portion 422. Plug 506 is an example implementation of plug portion 420. Label 508 is an example implementation of label 426, and label 510 is an example implementation of label 424.

In this example, a wiring diagram analysis process may identify plug 506 using the "P" in label 510 for plug 506, and identify receptacle 504 using the "J" in label 508. Offset 512 is the distance between label 508 and receptacle 504, while offset 514 is the distance between label 510 and plug 506. Pin numbers 516 identify the pins contained within connector 502.

Turning now to FIG. 6, an illustration of a portion of an output containing a connector is depicted in accordance with an advantageous embodiment. Output 600 is an example implementation of output 306 in FIG. 3. A wiring diagram analysis process generated output in these examples. Output 600 represents plug 500 of FIG. 5 in a target format, such as format 310 in FIG. 3. In this advantageous embodiment, the output is XML and the format is Common Electrical Electronic Data System format (CEEDS).

Code 602 represents plug 502 and code 604 represents receptacle 504. Designator 606 and designator 608 are representations of labels 508 and 510 in the target format. Additionally, orientations 618 and 620 reflect the rightward-facing direction of receptacle 504 and leftward-facing direction of plug 506, respectively. In other advantageous embodiments, orientations 618 and 620 reflect the upward-facing or downward-facing direction of receptacle 504 and upward-facing or downward-facing direction of plug 506.

Offsets 512 and 514 are also represented in output 600 by offset 614 and offset 616, respectively. Edges 610 and 612 are example implementations of number of coordinates 306 of FIG. 3. Edges 610 and 612 represent the coordinates at which connector 502 is to be presented in the target format. Additionally, offsets 512 and 514 and edges 610 and 612 may be modified from connector 502 to form offsets 614 and 616. For example, offsets 512 and 514 and edges 610 and 612 may have been multiplied by a scaling factor, such as scaling factor 340, prior to output 600 being generated. Terminals 506 and 516 are also represented in output 600 by terminals 622 and 624.

Figure 7:
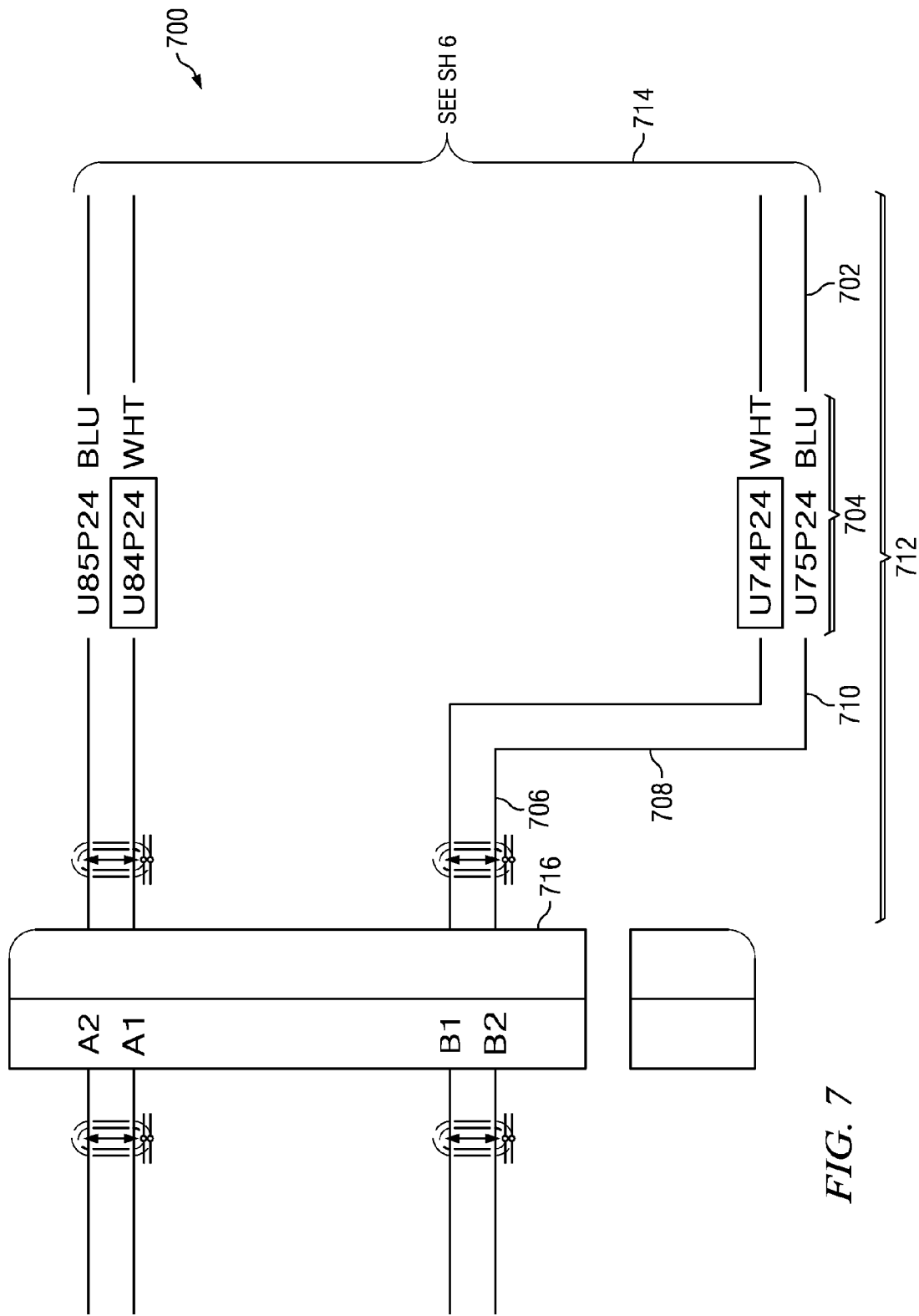
FIG. 7 depicts an illustration of a portion of a wiring diagram containing a wire in accordance with an advantageous embodiment.

Turning now to FIG. 7, a portion of a wiring diagram containing a wire is depicted in accordance with an advantageous embodiment. Portion 700 is a portion of a wiring diagram, such as wiring diagram 306 in FIG. 3. Portion 700 may be processed by a wiring diagram analysis process, such as wiring diagram analysis process 304. Portion 700 may be stored in a format, such as format 318.

Wire 712 is present in portion 700. Wire 712 is an example implementation of wire 402 in FIG. 4. In this example, wire 712 extends from connector 716 to reference 714. Reference 714 is a reference to another wiring diagram, such as reference 404. Wire 712 comprises line segments 706, 708, 710, and 702. Label 704 indicates an identifier for wire 712, such as identifier 348 in FIG. 3. Label 704 also indicates through the "BLU" portion of label 704 that the color of the wire is blue.

Turning now to FIG. 8, an illustration of a portion of an output containing a wire is depicted in accordance with an advantageous embodiment. Output 800 is an example implementation of output 306 in FIG. 3. A wiring diagram analysis process generated output in these examples. Output 800 represents wire 712 of FIG. 7 in a target format, such as format 310. In this advantageous embodiment, the output is XML and the format is Common Electrical Electronic Data System format (CEEDS).

Code 802 represents wire 712 in output 800. Identifier 804 represents label 704 in output 800. Identifier 804 is an example implementation of identifier 348 in FIG. 3. Output 800 also includes gauge 806. Gauge 806 is an indication of the thickness of the wire represented by wire 712 in output 800.

In this advantageous embodiment, the wiring diagram analysis process splits wire 712 into line segments present in portion 700. The wiring diagram analysis process then modifies the coordinates of the line segments from portion 700 by multiplying the coordinates by a scaling factor, such as scaling factor 340. Of course, in some advantageous embodiments, the scaling factor is absent.

Thus, the wiring diagram analysis process stores output 800 that includes segments 810, 812, 814, 816, and 818. Harness 808 represents the wiring harness of which wire 712 is a part. Harness 808 may be retrieved from information associated with connector 716 to be included in output 800. Segment 816 differs from the segments 810, 812, 814, and 818 in that segment 816 represents the blank space behind label 704. In this advantageous embodiment, the wiring diagram analysis process writes a "*" for the mode parameter to segment 816 to indicate that segment 816 is to be presented as transparent.

Turning now to FIG. 9, a flowchart of a process for processing a wiring diagram is depicted in accordance with an advantageous embodiment. The process may be performed by wiring diagram analysis process 304 in wiring diagram processing environment 300 in FIG. 3.

The process begins by identifying information associated with a number of components in the wiring diagram (operation 902). The information may be associated with one component in the number of components. The information is associated with the number of components in that the information describes a property or characteristic of the component. Non-limiting examples of the information include coordinates, labels, orientation, dimensions, and identifiers.

The process then identifies a scaling factor between a first format for the wiring diagram and a second format used by a software application configured to use wiring diagrams in the second format (operation 904). For example, the scaling factor may be identified by dividing the width of a connector in the second format by the width of a connector in the first format.

The process then applies the scaling factor to the information identified as being associated with the number of components in the wiring diagram to form processed information (operation 906). Applying the scaling factor may comprise multiplying the information by the scaling factor. In some advantageous embodiments, applying the scaling factor means multiplying the information by the scaling factor only when the information is a dimension, a distance, or a number of coordinates. The process terminates thereafter.

Figure 10B:
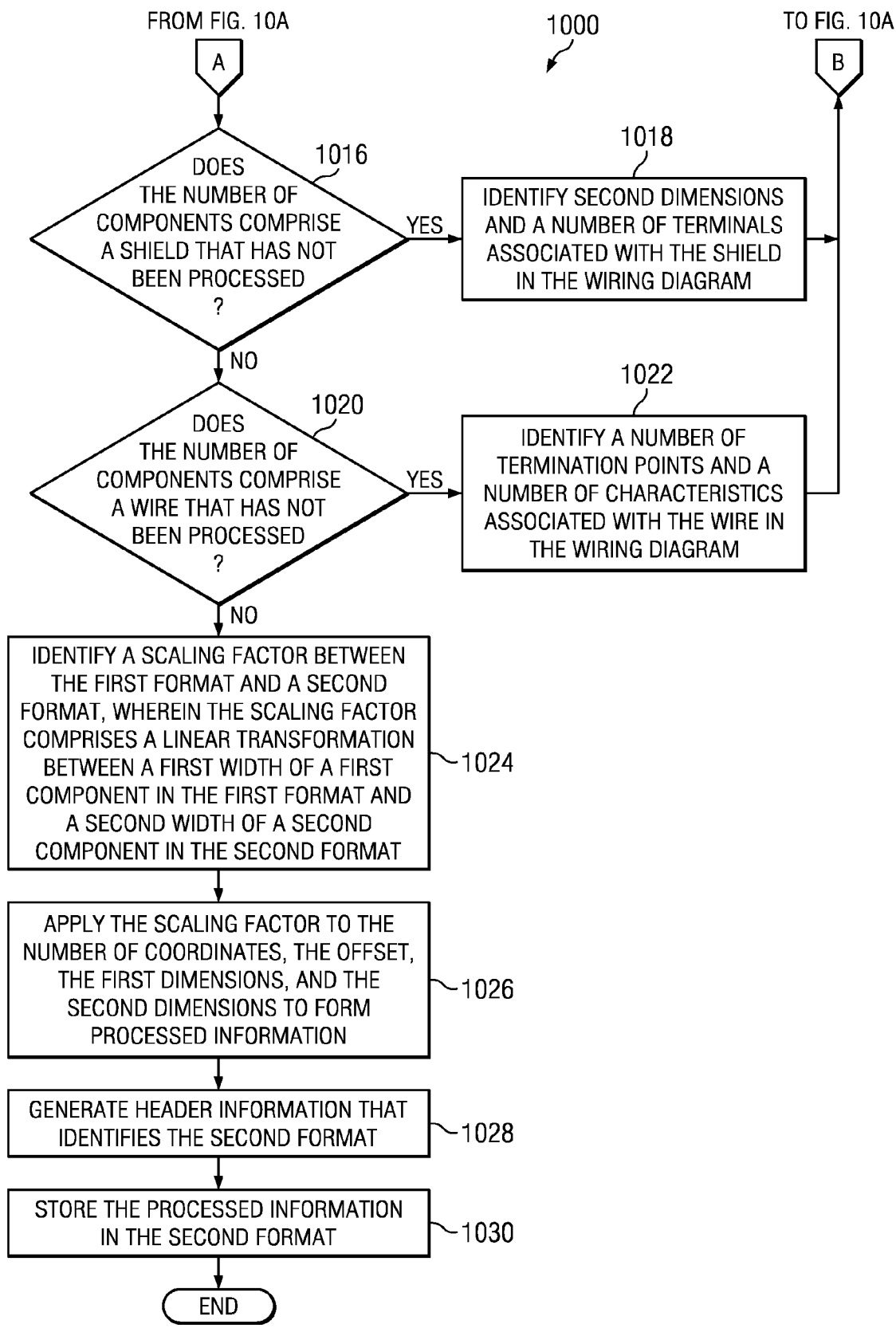
FIG. 10 depicts a flowchart of an additional process for processing a wiring diagram in accordance with an advantageous embodiment.

Turning now to FIG. 10, a flowchart of an additional process for processing a wiring diagram is depicted in accordance with an advantageous embodiment. The process may be performed by wiring diagram analysis process 304 in wiring diagram processing environment 300 of FIG. 3.

The process begins by identifying a number of components in the wiring diagram from a number of graphical primitives in the wiring diagram, wherein the wiring diagram is stored in a first format (operation 1002). A graphical primitive is a geometric shape located in the wiring diagram. For example, a rectangle and a circle stored in the wiring diagram are graphical primitives. In some advantageous embodiments, graphical primitives also comprise text elements in the wiring diagram.

The process then identifies a number of coordinates for a location of each of the number of components using the wiring diagram (operation 1004). The number of coordinates may be located by identifying a distance from two or more edges of the wiring diagram. The method then identifies a number of labels for the each of the number of components and an offset for the number of labels in the wiring diagram (operation 1006).

The process then determines whether the number of components comprise a connector that has not been processed (operation 1008). If the number of components comprise a connector that has not been processed, the process identifies an orientation of the connector, a plug portion of the connector, and a receptacle portion of the connector based on a label in the wiring diagram (operation 1010). The process then returns to operation 1008.

If the number of components do not comprise a connector that has not been processed at operation 1008, the process determines whether the number of components comprise a line replaceable unit that has not been processed (operation 1012). If the process determines that the number of components comprise a line replaceable unit, the process identifies first dimensions associated with the line replaceable unit, a number of receptacles associated with the line replaceable unit in the wiring diagram, a number of plugs associated with the line replaceable unit in the wiring diagram, and a number of part identifiers associated with the line replaceable unit in the wiring diagram (operation 1014). The process then returns to operation 1008.

If the process determines that the number of components does not comprise a line replaceable unit at operation 1014, the process determines whether the number of components comprise a shield that has not been processed (operation 1016). If the process determines that the number of components comprise a shield that has not been processed, the process identifies second dimensions and a number of terminals associated with the shield in the wiring diagram (operation 1018). The process then returns to operation 1008.

If the process determines that the number of components does not comprise a shield that has not been processed at operation 1016, the process determines whether the number of components comprise a wire that has not been processed. (operation 1020). If the process determines that the number of components comprise a wire that has not been processed, the process identifies a number of termination points and a number of characteristics associated with the wire in the wiring diagram (operation 1022). The process then returns to operation 1008. If the process determines that the number of components does not comprise a wire that has not been processed at operation 1020, the process proceeds to operation 1024.

The process then identifies a scaling factor between the first format and a second format, wherein the scaling factor comprises a linear transformation between a first width of a first component in the first format and a second width of a second component in the second format (operation 1024). The process then applies the scaling factor to the number of coordinates, the offset, the first dimensions, and the second dimensions to form processed information (operation 1026). The process then generates header information that identifies the second format (operation 1028). The process then stores the processed information in the second format (operation 1030). The process terminates thereafter.

Figure 11:
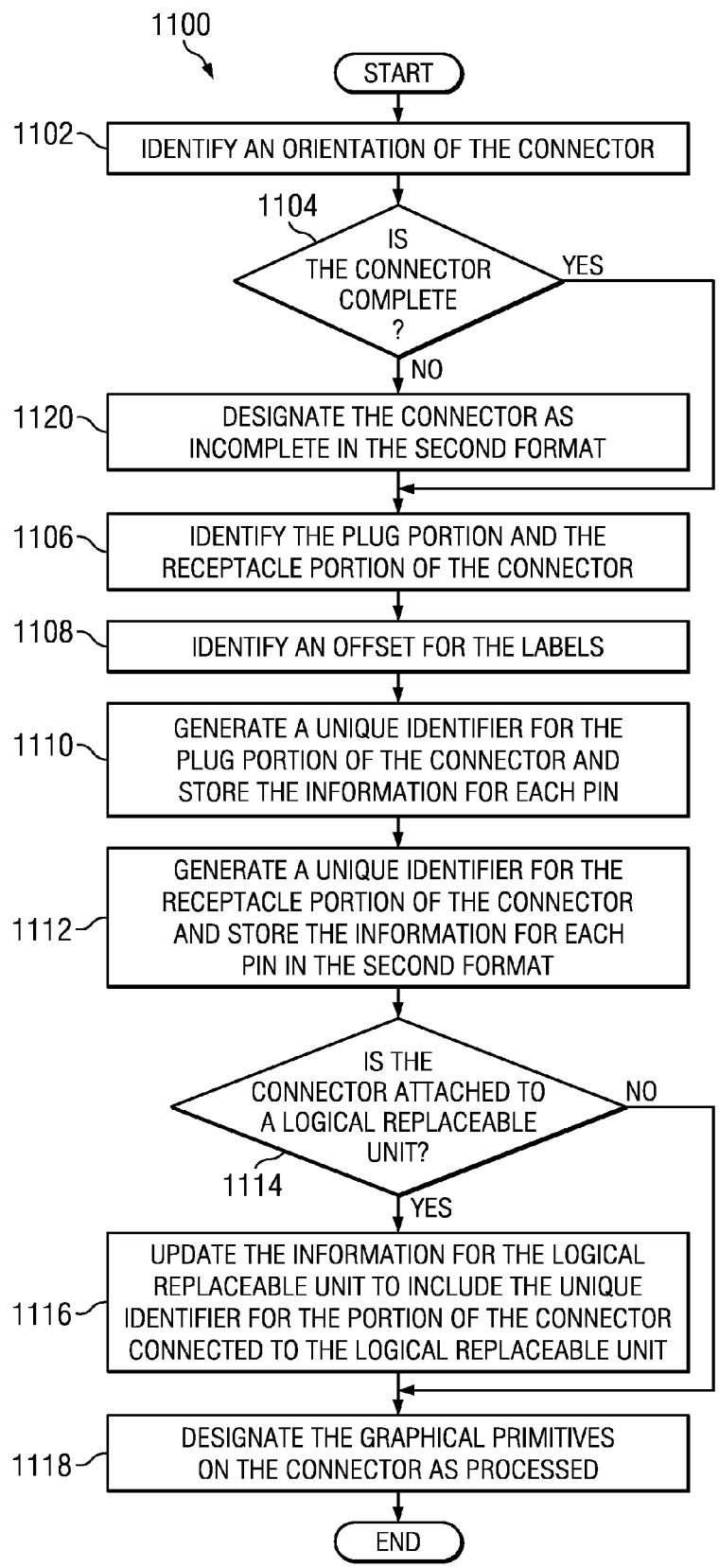
FIG. 11 depicts a flowchart of a process for identifying information associated with a connector in accordance with an advantageous embodiment.

Turning now to FIG. 11, a flowchart of a process for identifying information associated with a connector is depicted in accordance with an advantageous embodiment. The process may be performed by wiring diagram analysis process 304 in wiring diagram processing environment 300 of FIG. 3. The process may be an example implementation of operation 902 in FIG. 9.

The process begins by identifying an orientation of the connector (operation 1102). The process then determines whether the connector is complete (operation 1104). The connector is complete if the entirety of the connector is contained in the wiring diagram. If only a portion of the connector is presented in the wiring diagram, the connector is considered incomplete. The connector may be incomplete if another portion of the connector is presented in another wiring diagram. In one advantageous embodiment, a portion of a boundary of the connector in the wiring diagram is represented with a curved line when the connector is incomplete.

If the process determines that the connector is not complete, the process designates the connector as incomplete in the second format (operation 1120). The process may designate the connector as incomplete in the second format by storing the designation in the second format. For example, the process may store a value of 1 for a property labeled "broken" if the connector is incomplete and a value of 0 for the property if the connector is complete. The process then proceeds to operation 1106. If the process determines that the connector is complete at operation 1104, the process identifies the plug portion and the receptacle portion of the connector (operation 1106). The process then identifies an offset for the labels (operation 1108). The process then generates a unique identifier for the plug portion of the connector and stores the information for each pin (operation 1110).

The process proceeds by generating a unique identifier for the receptacle portion of the connector and stores the information for each pin in the second format (operation 1112). The process then determines whether the connector is attached to a line replaceable unit (operation 1114). If the process determines that the connector is attached to a line replaceable unit, the process updates the information for the line replaceable unit to include the unique identifier for the portion of the connector connected to the line replaceable unit (operation 1116). The process then proceeds to operation 1118. If the process determines that the connector is not attached to a line replaceable unit at operation 1114, the process designates the graphical primitives of the connector as processed (operation 1118). The process terminates thereafter.

Turning now to FIG. 12, a flowchart of a process for identifying information associated with a line replaceable unit, a shield, or a reference is depicted in accordance with an advantageous embodiment. The process may be performed by wiring diagram analysis process 304 in wiring diagram processing environment 300 in FIG. 3. The process may be an example implementation of operation 902 in FIG. 9.

The process begins by generating a unique identifier for the component (operation 1202). The component may be a line replaceable unit, a shield, or a reference to another wiring diagram. In another advantageous embodiment, the component may be another electrical symbol. For example, the component may be a circuit breaker. In such an advantageous embodiment, the process may identify an alphanumeric code that designates the type of component in the second format.

The process then identifies the coordinates for the location of the component in the second format and properties of the component (operation 1204). The process then stores the unique identifier, coordinates, and properties of the component in the second format (operation 1206). The process then designates the graphical primitives of the component as processed (operation 1208). The process terminates thereafter.

Figure 13:
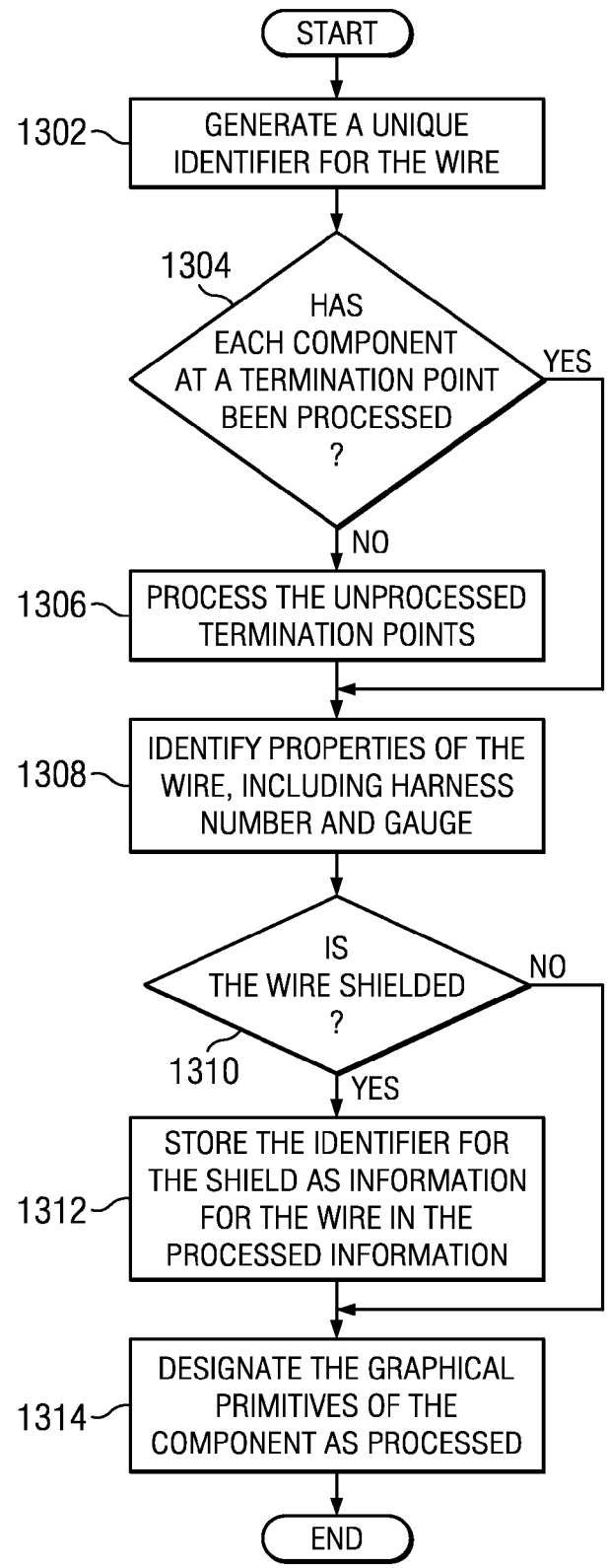
FIG. 13 depicts a flowchart of a process for identifying information associated with a wire in accordance with an advantageous embodiment.

Turning now to FIG. 13, a flowchart of a process for identifying information associated with a wire is depicted in accordance with an advantageous embodiment. The process may be performed by wiring diagram analysis process 304 in wiring diagram processing environment 300 in FIG. 3. The process may be an example implementation of operation 902 in FIG. 9.

The process begins by generating a unique identifier for the wire (operation 1302). The process then determines whether each component at a termination point been processed (operation 1304). A termination point is a point at which the conductive portion of the wire is connected to another component of the wiring system. If the process determines that each component at a termination point has not been processed, the process then processes the unprocessed termination points (operation 1306). Processing the unprocessed termination points may be achieved by performing the process in FIG. 10, the process in FIG. 11, or the process in FIG. 12. The process then proceeds to operation (1308).

If the process determines that each component at a termination point has been processed at operation 1304, the process identifies properties of the wire, including harness number and gauge (operation 1308). The process then determines whether the wire is shielded. (operation 1310) If the process determines that the wire is shielded, the process stores the identifier for the shield as information for the wire in the processed information (operation 1312). The process then proceeds to operation 1314.

If the process determines that the wire is not shielded, the process designates the graphical primitives of the component as processed (operation 1314). The process terminates thereafter.

The flowcharts and block diagrams in the different depicted embodiments illustrate the architecture, functionality, and operation of some possible implementations of apparatus and methods in different advantageous embodiments. In this regard, each block in the flowcharts or block diagrams may represent a module, segment, function, and/or a portion of an operation or step. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved. Also, other blocks may be added in addition to the illustrated blocks in a flowchart or block diagram.

The different advantageous embodiments allow wiring diagrams to be converted from one format to another format. The conversion allows legacy wiring diagrams to be converted into standard formats that are currently supported in numerous software packages. Because human recreation of the wiring diagram is avoided, errors and costs are reduced.

Thus, the different advantageous embodiments provide a method, computer program product, and apparatus for processing a wiring diagram. Information associated with a number of components in the wiring diagram is identified. A scaling factor between a first format for the wiring diagram and a second format used by a software application configured to use wiring diagrams in the second format is identified. The scaling factor is applied to the information identified as being associated with the number of components in the wiring diagram to form processed information.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for processing a wiring diagram using a processor, the method comprising:
   identifying, using the processor, information associated with a number of components in the wiring diagram;
   identifying, using the processor, a scaling factor between a first format for the wiring diagram and a second format used by a software application configured to use wiring diagrams in the second format, including identifying a linear transformation between a first width of a first component in the first format and a second width of a second component in the second format; and
   applying, using the processor, the scaling factor to the information to form processed information.

2. The method of claim 1 further comprising:
   storing the processed information in the second format to form an output.

3. The method of claim 2 further comprising:
   storing an identification of the second format in the output.

4. The method of claim 3, wherein the identification is header information, the second format is a Common Electrical Electronic Data System (CEEDS) format and the output is extensible markup language.

5. The method of claim 1 wherein the step of identifying the information associated with the number of components in the wiring diagram comprises:
   identifying the number of components in the wiring diagram; and
   identifying the information for the number of components identified in the wiring diagram.

6. The method of claim 5, wherein the step of identifying the number of components in the wiring diagram further comprises:
   identifying a number of graphical primitives in the wiring diagram that comprise the number of components; and
   identifying the number of components using the number of graphical primitives.

7. The method of claim 1, wherein the step of identifying the information associated with the number of components in the wiring diagram further comprises:
   identifying a number of coordinates for a location of each of the number of components in the first format using the wiring diagram; and
   identifying a number of labels for the each of the number of components and a number of offsets for the number of labels in the wiring diagram, wherein the information comprises the number of coordinates, the number of labels, and the number of offsets.

8. The method of claim 1, wherein the number of components comprise a connector, and wherein the step of identifying the information associated with the number of components in the wiring diagram further comprises:
   identifying an orientation of the connector in the wiring diagram; and
   identifying a plug portion of the connector and a receptacle portion of the connector in the wiring diagram based on a label in the wiring diagram, wherein the information comprises the orientation, the plug portion, the receptacle portion, and the label.

9. The method of claim 8 further comprising:
   determining whether the connector is connected to a line replaceable unit in the wiring diagram; and
   responsive to the connector being connected to the line replaceable unit in the wiring diagram, associating an identifier for the receptacle portion with the line replaceable unit in the wiring diagram, wherein the information further comprises the identifier.

10. The method of claim 1, wherein the number of components comprises a line replaceable unit, and wherein the step of identifying the information associated with the number of components in the wiring diagram further comprises:
    identifying dimensions associated with the line replaceable unit in the wiring diagram;
    identifying a number of receptacles and a number of plugs associated with the line replaceable unit in the wiring diagram; and
    identifying a number of part identifiers associated with the line replaceable unit in the wiring diagram, wherein the information comprises the dimensions, the number of receptacles, the number of plugs, and the number of part identifiers.

11. The method of claim 1, wherein the number of components comprises a shield, wherein the shield comprises a component that protects another component in the number of components from an effect and wherein the step of identifying the information associated with the number of components in the wiring diagram further comprises:
    identifying dimensions associated with the shield in the wiring diagram; and
    identifying a number of terminals associated with the shield in the wiring diagram, wherein the information comprises the dimensions and the number of terminals.

12. The method of claim 1, wherein the step of identifying the information associated with the number of components in the wiring diagram further comprises:
    selecting an identifier for each of the number of components, wherein the identifier represents a component type for the each of the number of components; and
    identifying a number of electrical contacts associated with the each of the number of components, wherein the information comprises the identifier and the number of electrical contacts.

13. The method of claim 1, wherein the number of components comprises a wire, and wherein the step of identifying the information associated with the number of components in the wiring diagram further comprises:
    identifying a number of termination points associated with the wire;
    responsive to the number of termination points comprising a connector, associating the number of termination points with the connector; and
    identifying a number of characteristics associated with the wire, wherein the information comprises the number of termination points and the number of characteristics.

14. The method of claim 13, wherein the number of characteristics comprise a harness number and a gauge of the wire.

15. The method of claim 1, wherein the wiring diagram is a first wiring diagram, wherein the number of components comprises a reference to a second wiring diagram, and identifying the information associated with the number of components in the first wiring diagram further comprises:

identifying dimensions associated with the reference in the first wiring diagram, wherein the information comprises the dimensions.

16. The method of claim 1, wherein the first component and the second component are connectors.

17. The method of claim 1, wherein the step of identifying the information associated with the number of components in the wiring diagram further comprises:
identifying a number of coordinates for a number of polygons that represent the number of components, wherein the information comprises the number of coordinates.

18. A non-transitory computer readable storage medium storing program code comprising:
a first program code which, when executed, is configured to identify information associated with a number of components in a wiring diagram;
a second program code which, when executed, is configured to identify a scaling factor between a first format for the wiring diagram and a second format used by a software application configured to use wiring diagrams in the second format, wherein identifying the scaling factor between the first format and the second format comprises identifying a linear transformation between a first width of a first component in the first format and a second width of a second component in the second format; and
a third program code which, when executed, is configured to apply the scaling factor to the information to form processed information.

19. An apparatus comprising:
a bus system;
a memory connected to the bus system; and
a processor unit connected to the bus system and configured to:
run a program to identify information associated with a number of components in a wiring diagram,
identify a scaling factor between a first format for the wiring diagram and a second format used by a software application stored on a non-transitory computer readable storage medium and configured to use wiring diagrams in the second format wherein identifying the scaling factor between the first format and the second format comprises identifying a linear transformation between a first width of a first component in the first format and a second width of a second component in the second format; and
apply the scaling factor to the information to form processed information.

* * * * *